(12) United States Patent
Han et al.

(10) Patent No.: US 12,615,945 B2
(45) Date of Patent: Apr. 28, 2026

(54) DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Baixiang Han, Shenzhen (CN); Kuo Gao, Shenzhen (CN); Zhibin Han, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1047 days.

(21) Appl. No.: 17/754,947

(22) PCT Filed: Dec. 21, 2021

(86) PCT No.: PCT/CN2021/139945
§ 371 (c)(1),
(2) Date: Jun. 22, 2023

(87) PCT Pub. No.: WO2023/108708
PCT Pub. Date: Jun. 22, 2023

(65) Prior Publication Data
US 2024/0155917 A1 May 9, 2024

(30) Foreign Application Priority Data
Dec. 16, 2021 (CN) .......................... 202111547872.6

(51) Int. Cl.
*H10K 59/80* (2023.01)
*H10K 59/122* (2023.01)
(Continued)

(52) U.S. Cl.
CPC ......... *H10K 59/872* (2023.02); *H10K 59/122* (2023.02); *H10K 59/124* (2023.02); *H10K 59/126* (2023.02); *H10K 59/873* (2023.02)

(58) Field of Classification Search
CPC .. H10K 59/872; H10K 59/122; H10K 59/124; H10K 59/126; H10K 59/873; H10K 59/8791; H10K 59/88
See application file for complete search history.

(56) References Cited

U.S. PATENT DOCUMENTS

2015/0179722 A1     6/2015  Koo
2016/0293883 A1*  10/2016  Hong ................... H10K 59/124
(Continued)

FOREIGN PATENT DOCUMENTS

CN      107017277 A      8/2017
CN      109148522 A      1/2019
(Continued)

OTHER PUBLICATIONS

International Search Report in International application No. PCT/CN2021/139945, mailed on Jun. 8, 2022.
(Continued)

*Primary Examiner* — Kevin Quarterman
(74) *Attorney, Agent, or Firm* — PV IP PC; Christopher S. Ruprecht; Wei Te Chung

(57) ABSTRACT

An embodiment of the present application discloses a display panel, which includes a display area and a border area defined outside the display area, wherein a thin film transistor layer is disposed on a substrate; a light-emitting device corresponds to the display area and disposed on the thin film transistor layer; a support member corresponds to the border area, the support member is disposed on the substrate, and the support member is configured to withstand external forces; and each of the support member includes at least one
(Continued)

gradation portion, and in a thickness direction of the display panel, a width of the gradation portion has a gradation tendency.

11 Claims, 4 Drawing Sheets

(51) Int. Cl.
H10K 59/124 (2023.01)
H10K 59/126 (2023.01)

(56) References Cited

U.S. PATENT DOCUMENTS

| 2017/0288007 | A1* | 10/2017 | Shin | G02F 1/1345 |
| 2019/0207150 | A1* | 7/2019 | Kwon | H10K 59/123 |
| 2019/0348476 | A1* | 11/2019 | Kato | G06F 3/0443 |
| 2020/0150790 | A1* | 5/2020 | Lee | G01L 5/22 |
| 2020/0161395 | A1* | 5/2020 | Kim | H10K 59/122 |
| 2020/0365667 | A1* | 11/2020 | Jo | H10K 59/121 |

FOREIGN PATENT DOCUMENTS

| CN | 109581708 | A | 4/2019 |
| CN | 110085133 | A | 8/2019 |
| CN | 110174803 | A | 8/2019 |
| CN | 111162097 | A | 5/2020 |
| CN | 111276520 | A | 6/2020 |
| CN | 111653605 | A | 9/2020 |

OTHER PUBLICATIONS

Written Opinion of the International Search Authority in International application No. PCT/CN2021/139945, mailed on Jun. 8, 2022.
Chinese Office Action issued in corresponding Chinese Patent Application No. 202111547872.6 dated Jun. 29, 2024, pp. 1-9.

* cited by examiner

DISPLAY PANEL

BACKGROUND OF INVENTION

Field of Invention

The present application relates to a field of display technology, in particular to a display panel.

Description of Prior Art

During the research and practice of the prior art, the inventor of the present application found that in a process of manufacturing an organic light-emitting diode display panel, it is usually necessary to laminating a sheet member, such as a polarizer or a cover plate, on the encapsulation layer by roller pressing. However, during the roller lamination process, areas where the roller stress is relatively concentrated are edges and corner areas of the display panel; and when the stress is concentrated in a local area, the display panel may be damaged.

SUMMARY OF INVENTION

An embodiment of the present application provides a display panel, which can reduce a risk of the display panel being damaged by an external force.

An embodiment of the present application provides a display panel including a display area and a border area defined outside the display area, the display panel further including:

a substrate;

a thin film transistor layer disposed on the substrate;

a light-emitting device corresponding to the display area and disposed on the thin film transistor layer; and at least one support member corresponding to the border area and disposed on the substrate, wherein the support member is configured to bear an external force; each of the support member includes at least one gradation portion, and in a thickness direction of the display panel, a width of the gradation portion has a gradation tendency.

Optionally, in some embodiments of the present application, in the thickness direction of the display panel, the gradation portion includes a first end surface and a second end surface arranged back to back, and an area of the first end surface is smaller than an area of the second end surface.

Optionally, in some embodiments of the present application, the first end surface is an end surface of an end of the support member.

Optionally, in some embodiments of the present application, the support member is formed by at least one of the gradation portion.

Optionally, in some embodiments of the present application, the support member is formed of a single layer.

Optionally, in some embodiments of the present application, the support member includes a stack of at least two sub-layers.

Optionally, in some embodiments of the present application, the first end surface is located on a side of the support member away from the substrate.

Optionally, in some embodiments of the present application, the first end surface is located on a side of the support member close to the substrate.

Optionally, in some embodiments of the present application, the support member includes a first support member and a second support member, a first end surface of the first support member is located at a side of the first support member away from the substrate, and a first end surface of the second support member is located at a side of the second support member close to the substrate.

Optionally, in some embodiments of the present application, the first support member is located on a side of the second support member away from the display area.

Optionally, in some embodiments of the present application, the first support member and the second support member are further provided with pore structures, and a number of the pore structures in the first support member is greater than a number of the pore structures in the second support member.

Optionally, in some embodiments of the present application, the gradation portion includes a first gradation portion and a second gradation portion, the first gradation portion includes at least one of the sub-layers, the second gradation portion includes at least one of the sub-layers; and the first gradation portion and the second gradation portion are stacked to form the support member.

Optionally, in some embodiments of the present application, in a same thickness direction of the display panel, the first gradation portion and the second gradation portion have a same gradation tendency.

Optionally, in some embodiments of the present application, in the same thickness direction of the display panel, the first gradation portion and the second gradation portion have opposite gradation tendencies.

Optionally, in some embodiments of the present application, a material of the gradation portion includes an organic material.

Optionally, in some embodiments of the present application, the display panel further includes a passivation layer and a pixel definition layer disposed on the passivation layer, and the passivation layer is disposed on the thin film transistor layer; and wherein the support member includes at least one of a portion of the passivation layer corresponding to the border area and a portion of the pixel definition layer corresponding to the border area.

Optionally, in some embodiments of the present application, the thin film transistor layer includes a plurality of insulating layers, a portion of at least one of the insulating layers is formed in the border area; and the support member is disposed on the at least one of the insulating layers.

Optionally, in some embodiments of the present application, the thin film transistor layer further includes a light-shielding layer, an active layer, a gate layer, and a source-drain layer; and the plurality of insulating layers are a first insulating layer, a second insulating layer, a third insulating layer, and a fourth insulating layer;

wherein the light-shielding layer is disposed on the substrate, the first insulating layer is disposed on the light-shielding layer, the active layer is disposed on the first insulating layer, the second insulating layer is disposed on the active layer, the gate layer is disposed on the second insulating layer, the third insulating layer is disposed on the gate layer, the source-drain layer is disposed on the third insulating layer, and the fourth insulating layer is disposed on the source-drain layer; and wherein a portion of the first insulating layer, a portion of the second insulating layer, a portion of the third insulating layer, and a portion of the fourth insulating layer are staked and located in the border area, and the support member is disposed on the fourth insulating layer.

Optionally, in some embodiments of the present application, the display panel further includes an encapsulation layer, the encapsulation layer covers the light-emitting device and at least covering a portion of the border area; and the encapsulation layer covers the support member.

Optionally, in some embodiments of the present application, the display panel further includes a sheet-shaped member disposed on the encapsulation layer and located directly above the support member, the sheet-shaped member includes at least one of a polarizer and a cover plate.

The display panel provided by an embodiment of the present application includes a display area and a border area defined outside the display area. The display panel includes a substrate, a thin film transistor layer, a light-emitting device, and a plurality of support members; the thin film transistor layer is disposed on the substrate; the light-emitting device corresponds to the display area and is disposed on the thin film transistor layer; the support member corresponds to the border area, the support member is disposed on the substrate, and the support member is configurated to withstand external forces; and each of the support members includes at least one gradation portion, and in a thickness direction of the display panel, a width of the gradation portion has a gradation tendency.

The present application adopts the support member containing the gradation portion to withstand the external force, which reduces a risk that the border area of the display panel is damaged by the external force; in addition, when the external force is applied to the support member, the gradation portion deforms to reduce impact of the external force.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
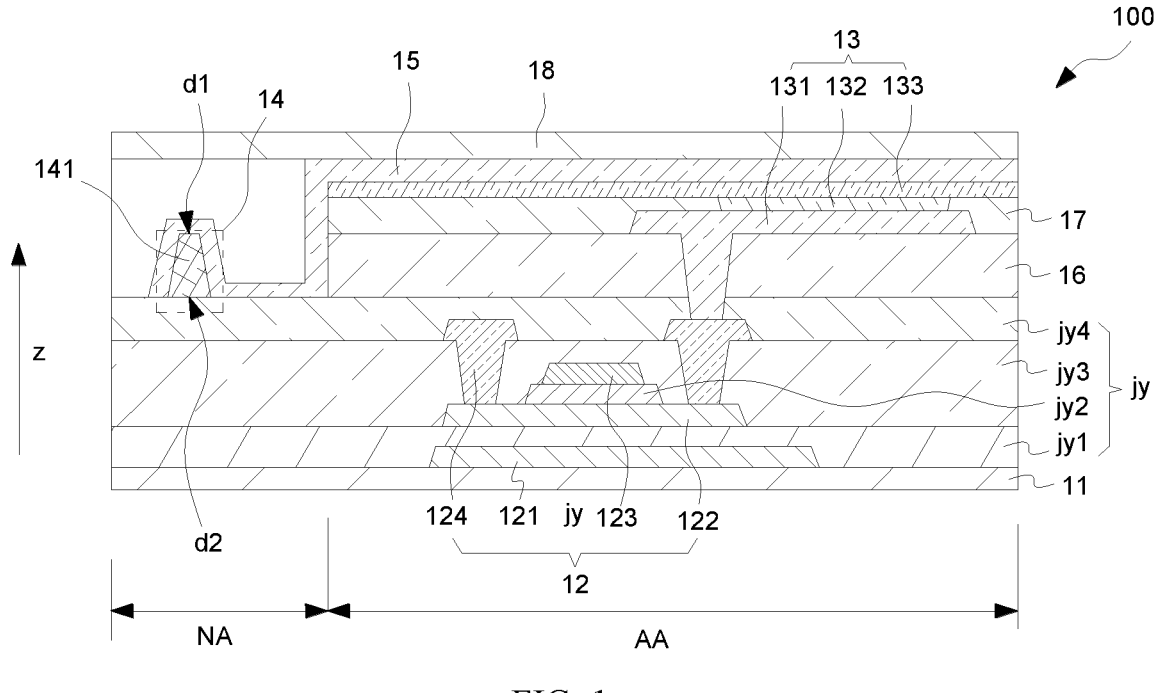
FIG. 1 is a schematic structural diagram of a display panel provided by the first embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide a display panel, which will be described in detail below. It should be noted that the order of description in the following embodiments is not intended to limit the preferred order of the embodiments.

Referring to FIG. 1, a first embodiment of the present application provides a display panel 100 including a display area AA and a border area NA disposed outside the display area AA. The display panel 100 includes a substrate 11, a thin film transistor layer 12, a light-emitting device 13, at least one support member 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configurated to withstand external forces. The support member 14 includes at least one gradation portion 141. In a thickness direction z of the display panel 100, a width of the gradation portion 141 has a gradual tendency.

The first embodiment of the present application adopts the support member 14 including the gradation portion 141 to bear the external force, which reduces a risk that the border area NA of the display panel 100 is damaged by the external force. In addition, when an external force is applied to the support member 14, the gradation portion 141 deforms to reduce an influence of the external force.

For example, when performing a roller lamination process by pressing the display panel 100 and other components, the display panel 100 is subjected to external impact or pressing, and the support member 14 according to the exemplary first embodiment effectively disperses and buffers a stress concentrated at the border area NA of the display panel 100 to prevent the encapsulation layer 15 from damage.

It should be noted that in the thickness direction z of the display panel 100, the width of the gradation portion 141 has a gradual tendency. For example, the width of the gradual portion 141 may be a single gradation tendency, such as a decreasing tendency or an increasing tendency, or mixed gradation tendencies, such as an increasing tendency first and then a decreasing tendency, or a decreasing tendency first and then an increasing tendency, or alternately increasing and decreasing tendencies. In the first embodiment, the thickness direction z of the display panel 100 refers to a thickness direction from a bottom to a top of the substrate 11, and the present application takes a width of the gradation portion 141 decreasing in the thickness direction z as an example for description.

Optionally, a number of the support member 14 may be one, for example, an enclosed structure formed by the support member 14 extending along an outer circumference of the display area AA.

The number of support members 14 may also be multiple, and multiple support members 14 are arranged at intervals outside the display area AA.

Optionally, the substrate 11 may be a rigid substrate or a flexible substrate. A material of the substrate 11 includes one of glass, sapphire, silicon, silicon dioxide, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, polyimide, or polyurethane.

Optionally, in a thickness direction z of the display panel 100, the gradation portion 141 includes a first end surface d1 and a second end surface d2 arranged back to back. An area of the first end surface d1 is smaller than an area of the second end surface d2.

That is, in the thickness direction z, the area of the gradation portion 141 has a decreasing tendency from the second end surface d2 to the first end surface d1. In this case, an end of the gradation portion 141 having the first end surface d1 is defined as a narrow end, and an end of the gradation portion 141 having the second end surface d2 is defined as a wide end.

Optionally, a cross-sectional shape of the gradation portion 141 may be a trapezoid, a trapezoid-like shape, or other shapes; the two waist edges of the trapezoid-like shape may be curved edges or other edges.

Optionally, the first end surface d1 is an end surface at an end of the support member 14. In other words, the narrow end serves as the end of the support member 14; that is, in the support member 14, the narrow end of the support member 14 is located away from the substrate 11 or faces the substrate 11.

In some embodiments, the first end surface d1 may also be arranged inside the support member 14; for example, two gradation portions 141 are stacked, the first end surface d1 of one of the gradation portions 141 and the first end surface d1 of another one of the gradation portions 141 are arranged opposite to and in contact with each other. That is, the second end surface d2 serves as the end surface of the end of the support member 14.

Optionally, the present application adopts a narrow end as the end of the support member 14. When an external force is applied to the narrow end of the support member 14, the narrow end is more likely to deform, so as to improve the performance of the support member 14 in absorbing external forces, and thereby reducing the impact of external force on the display panel 100.

Optionally, the support member 14 is formed by at least one of the gradation portions 141. For example, as shown in FIG. 1, the support member 14 includes a gradation portion 141, and the support member 14 is formed of a single layer.

The first end surface d1 is located at a side of the support member 14 away from the substrate 11. That is, the narrow end is located at the end of the support member 14 away from the substrate 11. Therefore, when an external force is applied to the display panel 100 from top to bottom, the support member 14 deforms from the narrow end to the wide end to buffer the external force which is applied from top to bottom, thereby protecting the display panel 100.

Optionally, a material of the gradation portion 141 includes an organic material. The use of organic materials to form the gradation portion 141 improves the deformation performance of the gradation portion 141.

Optionally, in some embodiments, the material of the gradation portion 141 may also include an inorganic material.

It should be noted that the gradation portion 141 can be formed together with other layers to save masks; but the gradation portion 141 and the other layers can also be formed separately.

Optionally, in some embodiments, a pore structure is further provided in the gradation portion 141 to improve the deformation performance of the support member 14.

Optionally, the display panel 100 of the first embodiment further includes a passivation layer 16 and a pixel definition layer 17 disposed on the passivation layer 16. The passivation layer 16 is disposed on the thin film transistor layer 12.

The support member 14 includes at least one of a portion of the passivation layer 16 corresponding to the border area NA and a portion of the pixel definition layer 17 corresponding to the border area NA.

For example, in the display panel 100 of the first embodiment, the support member 14 may be formed by the passivation layer 16 or the pixel definition layer 17.

The pixel definition layer 17 includes a plurality of openings to define areas. The light-emitting device 13 includes an anode 131, a light-emitting layer 132, and a cathode 133 which are formed on the passivation layer 16. The light-emitting layer 132 is disposed in the opening.

Optionally, a material of each of the passivation layer 16 and the pixel definition layer 17 is organic material. The organic material can be transparent photoresist, epoxy resin, polyimide, polyvinyl alcohol, polymethyl methacrylate, polystyrene, and the like.

Optionally, a material of the light-emitting layer 132 may be an organic material, such as tris(8-hydroxyquinoline) aluminum (III) (Alq3), bis(2-methyl-8-hydroxyquinoline-N1,O8)-(1,1'-biphenyl-4-hydroxy)aluminum (BAlq), 4,4-bis(2,2-diphenylvinyl)-1,1-diphenyl (DPVBi), tris(4-methyl-8-quinolinolato)Al (III) (Almq3), and 3-tert-butyl-9,10-bis(2-naphthalene)anthracene (TBADN).

The material of the light-emitting layer 132 may also be an inorganic material, for example, may be selected from one or more of group IV semiconductor nanocrystals, group II-V semiconductor nanocrystals, group II-VI semiconductor nanocrystals, group IV-VI semiconductor nanocrystals, and group III-V semiconductor nanocrystals, and III-VI group semiconductor nanocrystals. As an example, the material of the light-emitting layer 132 may be selected from one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, and gallium nitride quantum dots.

Optionally, the thin film transistor layer 12 includes multiple insulating layers jy. A portion of at least one of the insulating layers jy is formed in the border area NA. The support member 14 is disposed on at least one of the insulating layers jy.

The support member 14 is disposed on the insulating layer jy to heighten the support member 14, thereby shortening a step height between the support member 14 and a portion of the display panel 100 corresponding to the display area AA, so that the support member 14 can better withstand external forces, thereby protecting the display panel 100.

In some embodiments, the support member 14 may not be disposed on the insulating layer jy, that is, the support member 14 may be directly formed on the substrate 11.

Optionally, in the first embodiment, the thin film transistor layer 12 further includes a light-shielding layer 121, an active layer 122, a gate layer 123 and a source-drain layer 124. The plurality of insulating layers jy are the first insulating layer jy1, the second insulating layer jy2, the third insulating layer jy3, and the fourth insulating layer jy4, respectively.

The light-shielding layer 121 is disposed on the substrate 11. The first insulating layer jy1 is disposed on the light-shielding layer 121. The active layer 122 is disposed on the first insulating layer jy1. The second insulating layer jy2 is disposed on the active layer 122. The gate layer 123 is disposed on the second insulating layer jy2. The third insulating layer jy3 is disposed on the gate layer 123. The source-drain layer 124 is disposed on the third insulating layer jy3. The fourth insulating layer jy4 is disposed on the source-drain layer 124.

A portion of the first insulating layer jy1, a portion of the second insulating layer jy2, a portion of the third insulating layer jy3, and a portion of the fourth insulating layer jy4 are staked and located in the border area NA, and the support member 14 is disposed on the fourth insulating layer jy4.

That is, the support member 14 and the plurality of insulating layers jy located in the border area NA are stacked, thereby raising the support member 14, so that the support member 14 can better withstand external forces.

It should be noted that the thin film transistor layer 12 of the display panel 100 in the first embodiment includes a top-gate thin film transistor, but the present application is not particularly limited thereto. For example, it may also be a bottom-gate thin film transistor, a double-gate thin film transistor, or a thin film transistor having a self-aligned back-channel structure. When the thin film transistor layer 12 includes a bottom-gate thin film transistor, the light-shielding layer can be saved.

Optionally, the first insulating layer jy1 is a buffer layer, and its material may be an inorganic material such as silicon nitride, silicon oxide, silicon oxynitride, aluminum oxide, titanium oxide, or magnesium oxide.

A material of each of the second insulating layer jy2, the third insulating layer jy3, and the fourth insulating layer jy4 may be an inorganic material such as silicon nitride, silicon oxide, silicon oxynitride, aluminum oxide, and magnesium oxide.

Optionally, a material of the light-shielding layer 121 may be an inorganic metal material, such as chromium (Cr), molybdenum (Mo), manganese (Mn), etc., or a metal oxide material, such as $CrO_x$, $MoO_x$, $MnO2$, etc., or a mixed layer formed of metal and metal oxide; it can also be an organic black resin material, such as black polystyrene, black photoresist, etc.

A material of the active layer 122 may be an oxide semiconductor or polysilicon (poly-Si). The oxide semiconductor may include oxides of titanium (Ti), hafnium (Hf), zirconium (Zr), aluminum (Al), tantalum (Ta), germanium (Ge), zinc (Zn), gallium (Ga), tin (Sn), or indium (In), or their composite oxides, such as indium gallium zinc oxide (In—Ga—Zn—O), indium zinc oxide (Zn—In—O), zinc tin oxide (Zn—Sn—O), indium gallium oxide (In—Ga—O), indium tin oxide (In—Sn—O), indium zirconium oxide (In—Zr—O), indium zirconium zinc oxide (In—Zr—Zn—O), indium zirconium tin oxide (In—Zr—Sn—O), indium zirconium gallium oxide (In—Zr—Ga—O), indium aluminum oxide (In—Al—O), indium zinc aluminum oxide (In—Zn—Al—O), indium tin aluminum oxide (In—Sn—Al—O), indium aluminum gallium oxide (In—Al—Ga—O), indium tantalum oxide (In—Ta—O), indium Tantalum zinc oxide (In—Ta—Zn—O), indium tantalum tin oxide (In—Ta—Sn—O), indium tantalum gallium oxide (In—Ta—Ga—O), indium germanium oxide (In—Ge—O), indium germanium zinc oxide (In—Ge—Zn—O), indium germanium tin oxide (In—Ge—Sn—O), indium germanium gallium oxide (In—Ge—Ga—O), titanium indium zinc oxide (Ti—In—Zn—O), and hafnium indium zinc oxide (Hf—In—Zn—O)).

The gate layer 123 includes gates and signal lines. The source-drain layer 124 includes a source electrode, a drain electrode, and a signal line. Each of the gate layer 123 and the source-drain layers 124 can be made of a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), an alloy containing any of the above metal elements, or an alloy of a combination thereof. In addition, the gate layer 123 and the source-drain layer 124 may have a single-layered structure or a stacked structure of two or more layers.

Optionally, the encapsulation layer 15 covers at least a part of the border area NA. The encapsulation layer 15 covers the support member 14.

The encapsulation layer 15 is configured to cover the support member 14 to compensate for a step height between the support member 14 and the portion of the display panel 100 located in the display area AA, so as to facilitate the support member 14 to withstand the force.

Optionally, the encapsulation layer 15 includes a first inorganic layer, an organic layer, and a second inorganic layer that are stacked; and the encapsulation layer 15 may also include an organic layer and an inorganic layer that are stacked.

Optionally, the display panel 100 further includes a sheet-shaped member 18. The sheet-shaped member 18 is disposed on the encapsulation layer 15 and located directly above the support member 14. The sheet-shaped member 18 includes at least one of a polarizer and a cover plate.

When performing a roller lamination process by pressing the display panel 100 and other components, the support member 14 according to the exemplary first embodiment effectively disperse and buffer a stress concentrated at the border area NA of the display panel 100 to prevent the encapsulation layer 15 from damage. Specifically, when the roller lamination process is performed, the support member 14 can buffer the concentrated stress, and can delay its speed to achieve the effect of protecting the display panel 100.

Figure 2:
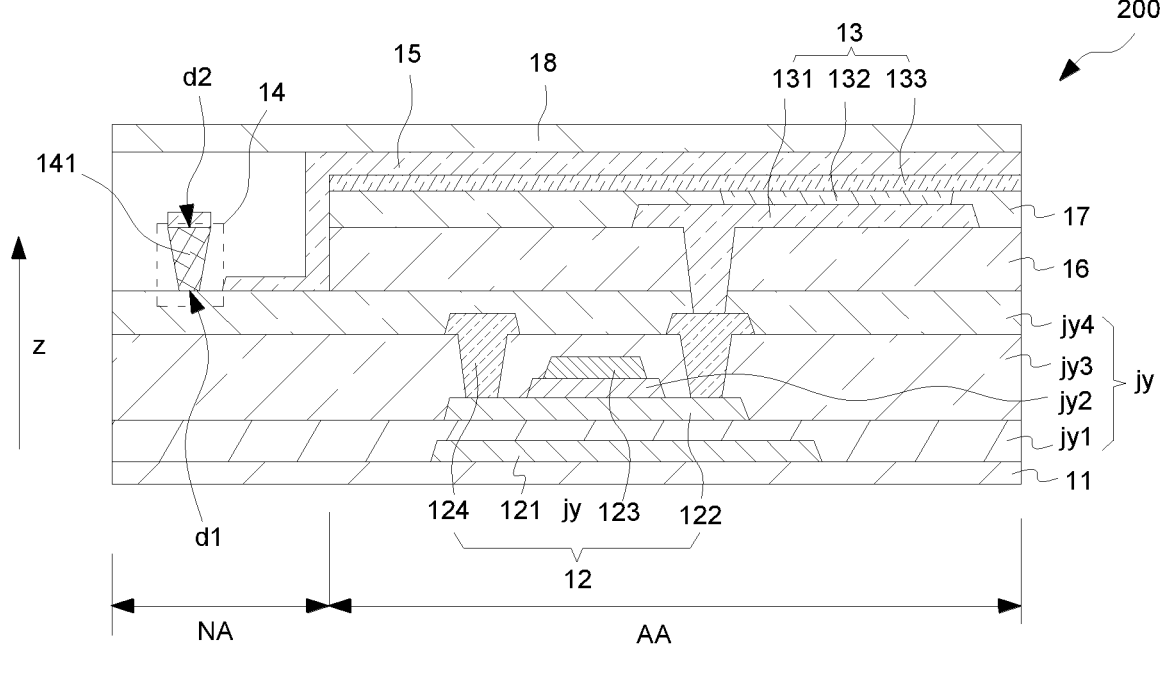
FIG. 2 is a schematic structural diagram of a display panel provided by a second embodiment of the present application.

Referring to FIG. 2, a second embodiment of the present application provides a display panel 200, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

A difference between the display panel 200 of the second embodiment and the display panel 100 of the first embodiment is that the first end surface d1 is located on a side of the support member 14 close to the substrate 11.

When pressing a back surface of the display panel 200 corresponding to the border area NA, the support member 14 according to the exemplary second embodiment effectively disperses the stress concentrated at the border area NA of the display panel 200, thereby preventing the encapsulation layer 15 from damage.

Because the encapsulation layer 15 is broken at an undercut space of the support member 14. Therefore, when the encapsulation layer 15 on the support member 14 is cracked due to external force, the crack will not propagate to the display area AA, thereby improving the encapsulation effect of the encapsulation layer 15.

Figure 3:
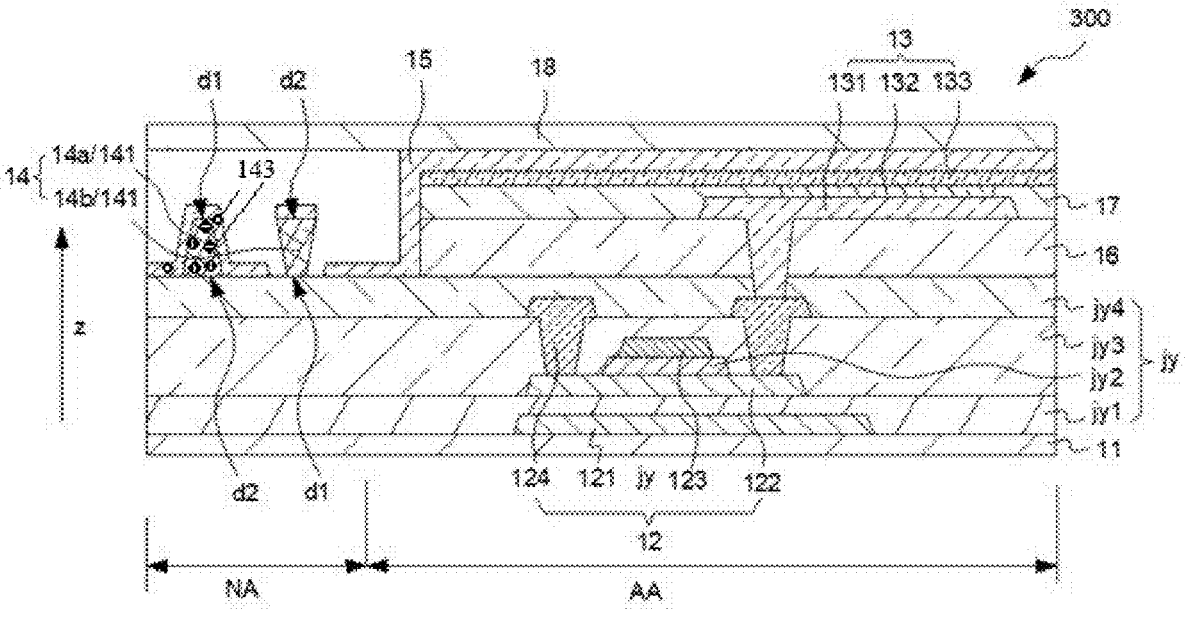
FIG. 3 is a schematic structural diagram of a display panel provided by a third embodiment of the present application.

Referring to FIG. 3, a third embodiment of the present application provides a display panel 300, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

A difference between the display panel 300 of the third embodiment and the display panel 100 of the first embodiment is that the support member 14 includes a first support member 14a and a second support member 14b. A first end surface d1 of the first support member 14a is located on a side of the first support member 14a away from the substrate 11. A first end surface d1 of the second support member 14b is located on a side of the second support member 14b close to the substrate 11.

When pressing a front and/or back side of the display panel 300 corresponding to the border area NA, the support member 14 of this embodiment can effectively disperse and buffer the stress applied to the border area NA, thereby achieving the effect of protecting the display panel 300. That is, the display panel 300 of the third embodiment can adapt to external forces from different directions.

Optionally, the first support member 14a is located on a side of the second support member 14b away from the display area AA.

Because the encapsulation layer 15 is broken at the undercut space of the second support member 14b, when the encapsulation layer 15 on the first support member 14a and the second support member 14b is cracked due to an external force, the crack will not propagate to the display area AA, thereby improving the encapsulation effect of the encapsulation layer 15.

Optionally, in some embodiments, the first support member 14a and the second support member 14b may also be provided with pore structures 143. A number of pore structures 143 in the first support member 14a is greater than a number of pore structures 143 in the second support member 14b. Such an arrangement enables greater deformation performance of the first support member 14a and the second support member 14b, and enables the support member 14 to progressively buffer external forces when laminating the device by roller pressing, thereby better protecting the display panel 100.

Figure 4:
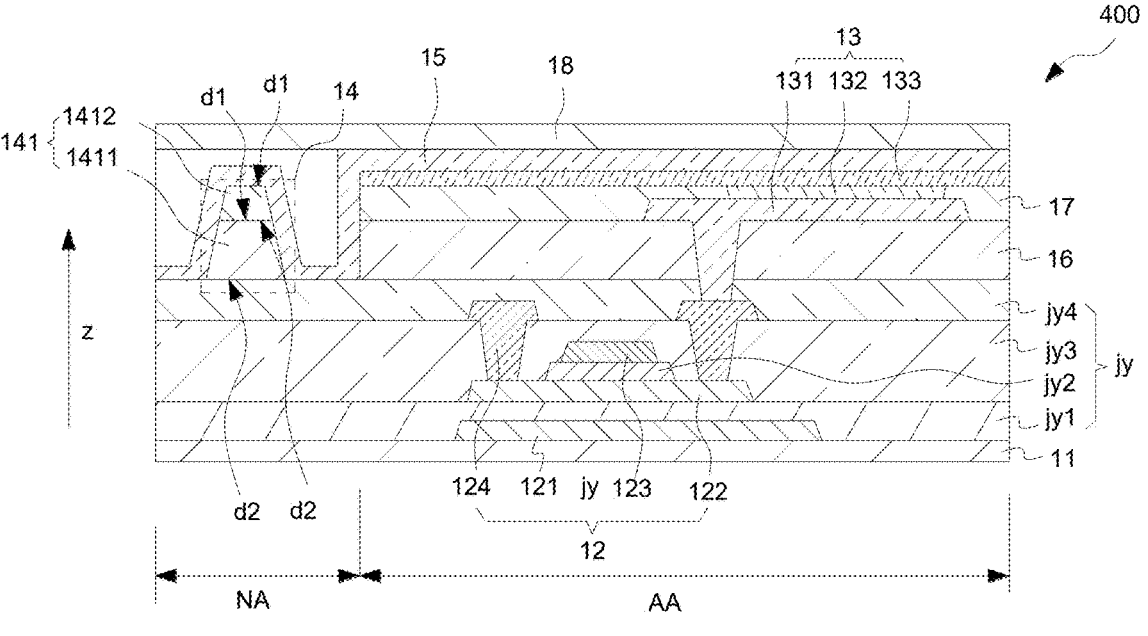
FIG. 4 is a schematic structural diagram of a display panel provided by a fourth embodiment of the present application.

Referring to FIG. 4, a fourth embodiment of the present application provides a display panel 400, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

The difference between the display panel 400 of the fourth embodiment and the display panels 100/200/300 of the above-mentioned embodiments is that the support member 14 includes a stack of at least two sub-layers.

It should be noted that, in some embodiments, the support member 14 may also include a non-gradation portion. The non-gradation portion and the gradation portion 141 are stacked. Specifically, one of the sub-layers serves as a non-gradation portion, and another one of the sub-layers serves as a gradation portion 141. In a thickness direction z of the display panel 400, a width of the non-gradation portion has a non-gradation tendency, for example, a width of the non-gradation portion remains unchanged or fluctuates.

The display panel 400 of the fourth embodiment is described by taking the support member 14 formed from the gradation portion 141 as an example.

Optionally, in the fourth embodiment, the gradation portion 141 includes a first gradation portion 1411 and a second gradation portion 1412. The first gradation portion 1411 includes at least one of the sub-layers. The second gradation portion 1412 includes at least one the sub-layers. The first gradation portion 1411 and the second gradation portion 1412 are stacked to form the support member 14.

Optionally, in the fourth embodiment, each of the first gradation portion 1411 and the second gradation portion 1412 including one of the sub-layers is taken as an example for illustration, but the present application is not particularly limited thereto.

Optionally, the first gradation portion 1411 is formed from the passivation layer 16. A portion of the passivation layer 16 formed in the border area NA is served as the first gradation portion 1411. In other words, the portion of the passivation layer 16 formed in the border area NA is served as the sub-layer of the first gradation portion 1411.

The second gradation portion 1412 is formed from the pixel definition layer 17; that is, the portion of the pixel definition layer 17 formed in the border area NA is served as the second gradation portion 1412. In other words, the portion of the pixel definition layer 17 formed in the border area NA is served as the sub-layer of the second gradation portion 1412.

The gradation portion 141 is formed by stacking multiple sub-layers to increase a height of the support member 14, which is convenient for reducing a step height between the support member 14 and the display area AA, thereby improving supporting performance of the support member 14.

Optionally, in the same thickness direction z of the display panel 400, the gradation tendencies of the first gradation portion 1411 and the second gradation portion 1412 are the same.

For example, taking FIG. 4 as an example, in the thickness direction z from the bottom to the top of the substrate 11, the widths of the first gradation portion 1411 and the second gradation portion 1412 both have decreasing gradation tendencies.

An area of the first end surface d1 of the first gradation portion 1411 is greater than or equal to an area of the second end surface d2 of the second gradation portion 1412 to improve the stability of the gradation portion 141.

Optionally, in some embodiments, the area of the first end surface d1 of the first gradation portion 1411 may also be smaller than the area of the second end surface d2 of the second gradation portion 1412.

Figure 5:
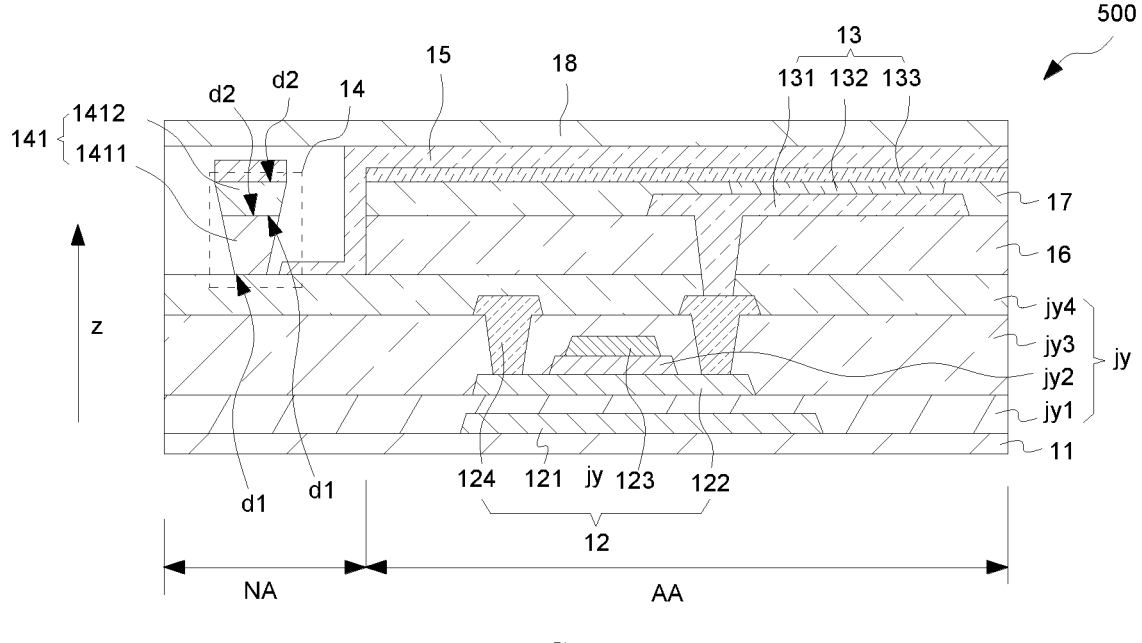
FIG. 5 is a schematic structural diagram of a display panel provided by a fifth embodiment of the present application.

Referring to FIG. 5, s fifth embodiment of the present application provides a display panel 500, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

A difference between the display panel 500 of the fifth embodiment and the display panel 400 of the fourth embodiment is that widths of the first gradation portion 1411 and the second gradation portion 1412 in the thickness direction z from the bottom to the top of the substrate 11 may also have increasing gradation tendencies.

Figure 6:
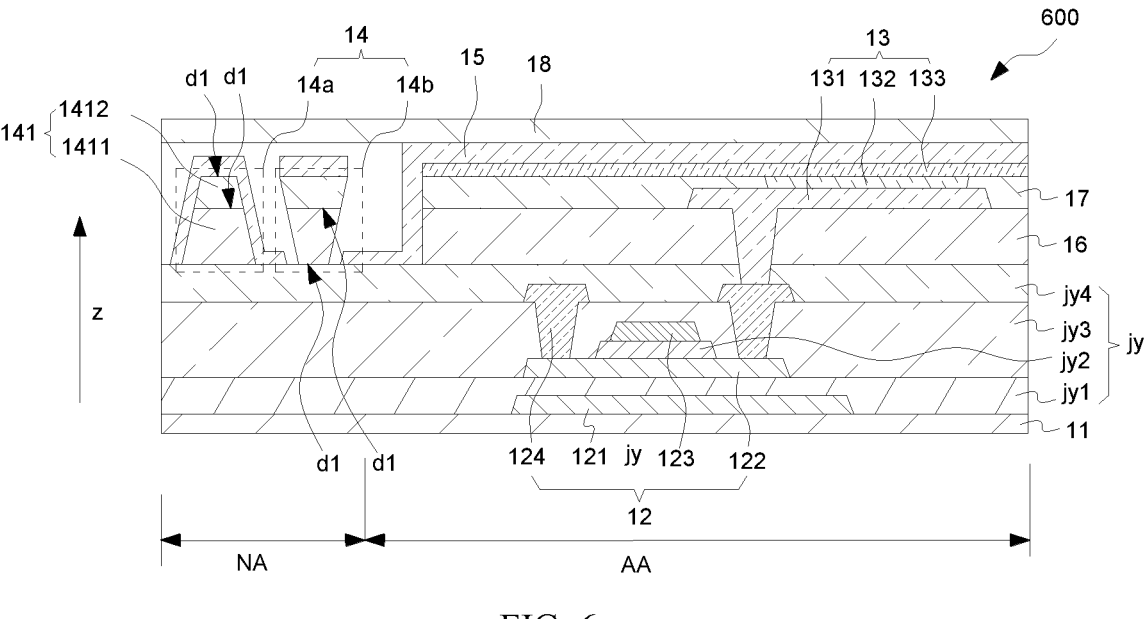
FIG. 6 is a schematic structural diagram of a display panel provided by a sixth embodiment of the present application.

Referring to FIG. 6, a sixth embodiment of the present application provides a display panel 600, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

A difference between the display panel 600 of the sixth embodiment and the display panel 400 of the fourth embodiment is that the support member 14 includes a first support member 14*a* and a second support member 14*b*. The first end surface d1 of the first support member 14 a is located at a side of the first support member 14 away from the substrate 11. The first end surface d1 of the second support member 14*b* is located at a side of the second support member 14 close to the substrate 11.

In the thickness direction z from the bottom to the top of the substrate 11, the widths of the first gradation portion 1411 and the second gradation portion 1412 in the first support member 14*a* may have increasing gradation tendencies. The widths of the first gradation portion 1411 and the second gradation portion 1412 in the second support member 14*b* may also have decreasing gradation tendencies.

Figure 7:
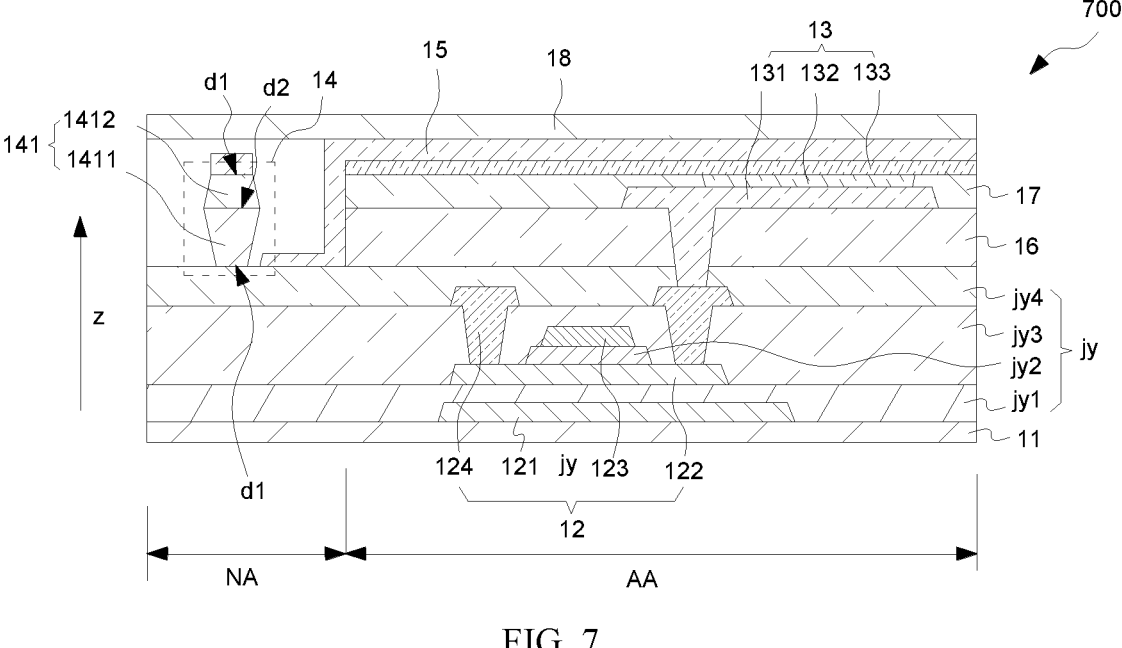
FIG. 7 is a schematic structural diagram of a display panel provided by a seventh embodiment of the present application.

Referring to FIG. 7, a seventh embodiment of the present application provides a display panel 700, which includes a substrate 11, a thin film transistor layer 12, a light-emitting device 13, a plurality of support members 14, and an encapsulation layer 15.

The thin film transistor layer 12 is disposed on the substrate 11. The light-emitting device 13 corresponds to the display area AA and is disposed on the thin film transistor layer 12. The encapsulation layer 15 is disposed on the light-emitting device 13.

The support member 14 corresponds to the border area NA. The support member 14 is disposed on the substrate 11. The support member 14 is configured to withstand external forces. A support member 14 includes at least one gradation portion 141 in the thickness direction z of the display panel 100. The width of the gradual portion 141 has a gradual tendency.

A difference between the display panel 700 of the seventh embodiment and the display panels 400/500/600 of the above-mentioned embodiments is that: in the same thickness direction z of the display panel 700, the first gradation portion 1411 and the second gradation portion 1412 have opposite gradation tendencies.

A width of the first gradation portion 1411 has an increasing gradation tendency. A width of the second gradation portion 1412 has a decreasing gradation tendency. In other words, opposite ends of the support member 14 are narrow ends to adapt to external forces from different directions and reduce a width of the border.

Because the encapsulation layer 15 is broken at an undercut space of the support member 14. Therefore, when the encapsulation layer 15 on the support member 14 is cracked due to external force, the crack will not propagate to the display area AA, thereby improving the encapsulation effect of the encapsulation layer 15.

The display panel provided by an embodiment of the present application includes a display area and a border area defined outside the display area. The display panel includes a substrate, a thin film transistor layer, a light-emitting device, and a plurality of support members; the thin film transistor layer is disposed on the substrate; the light-emitting device corresponds to the display area and disposed on the thin film transistor layer; the support member corresponds to the border area, the support member is disposed on the substrate, and the support member is configured to withstand external forces; and each of the support members includes at least one gradation portion, and in a thickness direction of the display panel, a width of the gradation portion has a gradation tendency.

The present application adopts the support member containing the gradation portion to bear the external force, which reduces a risk that the border area of the display panel is damaged by the external force; in addition, when the external force is applied to the support member, the gradation portion deforms to reduce an influence by the external force.

The display panel provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising a display area and a border area defined outside the display area, the display panel further comprising:

a substrate;

a thin film transistor layer disposed on the substrate;

a light-emitting device corresponding to the display area and disposed on the thin film transistor layer; and at least one support member corresponding to the border area and disposed on the substrate, wherein the support member is configured to bear an external force; each of the support members comprises at least one gradation portion, and in a thickness direction of the display panel, a width of the gradation portion has a gradation tendency;

wherein in the thickness direction of the display panel, the gradation portion comprises a first end surface and a second end surface arranged back to back, and an area of the first end surface is smaller than an area of the second end surface;

wherein the first end surface is an end surface of an end of the support member, the support member is formed by at least one of the gradation portions, and the support member is formed of a single layer;

wherein the support member comprises a first support member and a second support member, a first end surface of the first support member is located at a side of the first support member farthest from the substrate, and a first end surface of the second support member is located at a side of the second support member facing the substrate;

wherein the first support member is located on a side of the second support member farthest from the display area, the first support member and the second support member are further provided with pore structures, and a number of the pore structures in the first support member is greater than a number of the pore structures in the second support member.

2. The display panel according to claim 1, wherein a material of the gradation portion comprises an organic material.

3. The display panel according to claim 2, wherein the display panel further comprises a passivation layer and a pixel definition layer disposed on the passivation layer, and the passivation layer is disposed on the thin film transistor layer; and wherein the support member comprises at least one of a portion of the passivation layer corresponding to the border area and a portion of the pixel definition layer corresponding to the border area.

4. The display panel according to claim 1, wherein the thin film transistor layer comprises a plurality of insulating layers, a portion of at least one of the insulating layers is formed in the border area; and the support member is disposed on the at least one of the insulating layers.

5. The display panel according to claim 4, wherein the thin film transistor layer further comprises a light-shielding layer, an active layer, a gate layer, and a source-drain layer; and the plurality of insulating layers are a first insulating layer, a second insulating layer, a third insulating layer, and a fourth insulating layer;

wherein the light-shielding layer is disposed on the substrate, the first insulating layer is disposed on the light-shielding layer, the active layer is disposed on the first insulating layer, the second insulating layer is disposed on the active layer, the gate layer is disposed on the second insulating layer, the third insulating layer is disposed on the gate layer, the source-drain layer is disposed on the third insulating layer, and the fourth insulating layer is disposed on the source-drain layer; and wherein a portion of the first insulating layer, a portion of the second insulating layer, a portion of the third insulating layer, and a portion of the fourth insulating layer are stacked and located in the border area, and the support member is disposed on the fourth insulating layer.

6. The display panel according to claim 5, wherein the display panel further comprises an encapsulation layer, the encapsulation layer covers the light-emitting device and at least covering a portion of the border area; and the encapsulation layer covers the support member.

7. The display panel according to claim 6, wherein the display panel further comprises a sheet-shaped member disposed on the encapsulation layer and located directly above the support member, the sheet-shaped member comprises at least one of a polarizer and a cover plate.

8. A display panel, comprising a display area and a border area defined outside the display area, the display panel further comprising:

a substrate;

a thin film transistor layer disposed on the substrate;

a light-emitting device corresponding to the display area and disposed on the thin film transistor layer; and at least one support member corresponding to the border area and disposed on the substrate, wherein the support member is configured to bear an external force; each of the support members comprises at least one gradation portion, and in a thickness direction of the display panel, a width of the gradation portion has a gradation tendency;

wherein in the thickness direction of the display panel, the gradation portion comprises a first end surface and a second end surface arranged back to back, and an area of the first end surface is smaller than an area of the second end surface;

wherein the first end surface is an end surface of an end of the support member, the support member is formed by at least one of the gradation portions, and the support member comprises a stack of at least two sub-layers;

wherein the support member comprises a first support member and a second support member, a first end surface of the first support member is located at a side of the first support member farthest from the substrate, and a first end surface of the second support member is located at a side of the second support member facing the substrate;

wherein the first support member is located on a side of the second support member farthest from the display area, the first support member and the second support member are further provided with pore structures, and a number of the pore structures in the first support member is greater than a number of the pore structures in the second support member.

9. The display panel according to claim 8, wherein the gradation portion comprises a first gradation portion and a second gradation portion, the first gradation portion comprises at least one of the sub-layers, the second gradation portion comprises at least one of the sub-layers; and the first gradation portion and the second gradation portion are stacked to form the support member.

10. The display panel according to claim 9, wherein, in a same thickness direction of the display panel, the first gradation portion and the second gradation portion have a same gradation tendency.

11. The display panel according to claim 9, wherein, in the same thickness direction of the display panel, the first gradation portion and the second gradation portion have opposite gradation tendencies.

* * * * *